United States Patent
Sung

(10) Patent No.: US 7,446,013 B2
(45) Date of Patent: Nov. 4, 2008

(54) METHOD OF MEASURING PATTERN SHIFT IN SEMICONDUCTOR DEVICE

(75) Inventor: Woong Je Sung, Boocheon-si (KR)

(73) Assignee: Dongbu Electronics Co., Ltd., Seoul (KR)

(*) Notice: Subject to any disclaimer, the term of this patent is extended or adjusted under 35 U.S.C. 154(b) by 46 days.

(21) Appl. No.: 11/588,511

(22) Filed: Oct. 26, 2006

(65) Prior Publication Data

US 2007/0099358 A1 May 3, 2007

(30) Foreign Application Priority Data

Oct. 27, 2005 (KR) .................. 10-2005-0101693

(51) Int. Cl.
H01L 21/20 (2006.01)
(52) U.S. Cl. ..................................... 438/393
(58) Field of Classification Search ............ 438/11–18, 438/100, 105–107, 597, 612–613, 660–667, 438/252–255, 391–398; 257/48, 737
See application file for complete search history.

(56) References Cited

U.S. PATENT DOCUMENTS

2003/0139016 A1* 7/2003 Watanabe et al. .......... 438/393
2004/0152222 A1* 8/2004 Feudel et al. ................ 438/16
2006/0286745 A1* 12/2006 Park et al. .................. 438/255

* cited by examiner

Primary Examiner—Scott B. Geyer
Assistant Examiner—Andre' Stevenson
(74) Attorney, Agent, or Firm—Andrew D. Fortney

(57) ABSTRACT

Disclosed is a method of measuring a pattern shift in a semiconductor device. The method measures a mobility or shift distance of a stepped portion occurring between a buried layer surface and a substrate surface during an epitaxial process on the buried layer. The method includes the steps of: recognizing a first width ratio of a metallic wiring over a stepped pattern in an insulation film shifted by a certain distance and measuring a first capacitance value of a capacitor including the metallic wiring, forming a first pattern having a second width ratio different from the first width ratio, measuring a capacitance value of the first pattern, forming multiple patterns having width ratios different from the first and second width ratios, measuring capacitance values of the multiple patterns, establishing reference values using the measured capacitance values, and comparing the first capacitance value with any one of the established reference values to recognize a shift distance of the stepped pattern. Thus, when a well or plug region is formed in the epitaxial layer, the recognized and measured shift distance value can be considered such that the well or plug region can be formed at the correct position in the process.

19 Claims, 6 Drawing Sheets

METHOD OF MEASURING PATTERN SHIFT IN SEMICONDUCTOR DEVICE

This application claims the benefit of Korean Application No. 10-2005-0101693, filed on Oct. 27, 2005, which is incorporated by reference herein in its entirety.

BACKGROUND OF THE INVENTION

1. Field of the Invention

The present invention relates to a method of manufacturing a semiconductor device. More specifically, the invention relates to a method of measuring a pattern shift that may occur during the manufacturing process of semiconductor devices.

2. Background of the Related Art

In the manufacturing process of semiconductor devices, especially those involving formation of an epitaxial layer, a buried layer may be formed in order to isolate a device and increase the threshold voltage. The buried layer is generally formed so as to be precisely aligned with layers to be formed on top of the buried layer.

FIGS. 1a to 1c are cross-sectional views explaining a conventional method of forming a buried layer, an epitaxial layer, and regions stacked on top thereof.

As shown in FIG. 1a, an initial oxide layer (not shown) is formed on a P-type semiconductor substrate 10. After a mask for formation of a buried layer is formed on a desired area of the initial oxide layer, the initial oxide layer is patterned using the mask. Using the patterned initial oxide layer as a mask, N-type ion injection and drive-in diffusion of impurities are performed to form an N-type buried layer 12.

Thereafter, as shown in FIG. 1b, the patterned initial oxide layer is removed and a P-type epitaxial layer 14 is formed on the resulting formation of the N-type buried layer 12.

Then, as shown in FIG. 1c, a well region 16a is formed on a desired area of the P-type epitaxial layer 14.

On the other hand, as the N-type buried layer 12 is formed, a stepped portion A occurs between the buried layer surface and the substrate surface. In the epitaxial process for forming the epitaxial layer, the growth direction of single-crystalline silicon may not be perpendicular to the substrate, depending upon orientation of the substrate and process conditions. In this case, the above stepped portion ('A' in FIG. 1a) may shift to another place (the distance of the shift is designated 'B' in FIG. 1b) from its original position.

Therefore, since a location of the stepped portion shifts between the buried layer surface and the substrate surface, a layer to be formed within the epitaxial layer 14 (i.e., a well region or a plug implant) may be formed at a position 16a in FIG. 1c, which has been shifted from a position 16b in FIG. 1c (i.e., from the correct position in the process).

Thus, in order that the well-region, which is to be formed adjacent to the buried layer 12, is formed in the correct position, an offset must be employed to compensate for the shifted distance. At this time, the above offset is determined enduring wafer loss when in the process setup, and must be continuously monitored because it may change in various ways, depending upon the process conditions.

In case of mass production, however, every lot may be subject to wafer loss in order to continuously monitor the offset, thereby resulting in additional costs and increased time consumption.

Therefore, a fixed offset, established during the process setup phase, is applied in the course of the process. Because of this, alignment between the buried and epitaxial layer and layers formed on top thereof may be less precisely made.

SUMMARY OF THE INVENTION

The present invention has been made in order to solve the above problems. It is an object of the invention to provide a method of measuring a pattern shift in a semiconductor device during the manufacturing of semiconductor devices including formation of a buried layer and an epitaxial layer thereon, in which precise alignment between the buried and epitaxial layer and the layers formed on top thereof can be secured.

In order to accomplish the above object, according to one aspect of the invention, there is provided a method of measuring a pattern shift in manufacturing of a semiconductor device. The manufacturing process may include forming a buried layer within a semiconductor substrate, a stepped pattern being formed between the buried layer surface and the adjacent semiconductor substrate surface, forming an epitaxial layer on a top surface of the semiconductor substrate including the buried layer, where the stepped pattern may be shifted by a certain distance, forming an insulation film on top surface of the epitaxial layer, and forming a metallic wiring in a desired area of the insulation film. The method of measuring a pattern shift comprises the steps of: measuring a first capacitance value of a capacitor including an insulation film containing a stepped pattern having a shift distance, forming a first pattern having a second width ratio, which is different from the first width ratio of the capacitor including the insulation film containing the stepped pattern, measuring a capacitance value of the first pattern, forming multiple patterns having width ratios different from the first and second width ratios, measuring capacitance values of the multiple patterns, (optionally) establishing one or more reference values using the measured capacitance values, and comparing the first capacitance value with any one of the established reference values (or with the measured capacitance values) to recognize or determine the shift distance of the stepped pattern. For example, the capacitance measurements may be correlated to a movement or change in location of an upper electrode of the capacitor relative to the stepped pattern.

Preferably, the step of measuring the capacitance value includes the step of measuring a capacitance value depending on the thickness of an insulation film formed between the metallic wiring (e.g., the upper electrode) and the epitaxial layer.

Preferably, the method further comprises the step of forming a bonding region (e.g., a well or plug region) in a desired area within the epitaxial layer, after forming the epitaxial layer and before forming the insulation film.

DETAILED DESCRIPTION OF THE PREFERRED

EMBODIMENT

Figure 1A:
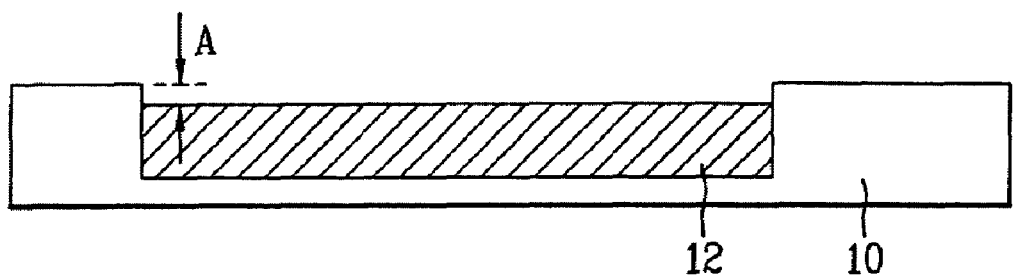
FIGS. 1a to 1c are cross-sectional views explaining a conventional technique for forming a buried layer/epitaxial layer and regions layered thereon.
Figure 1B:
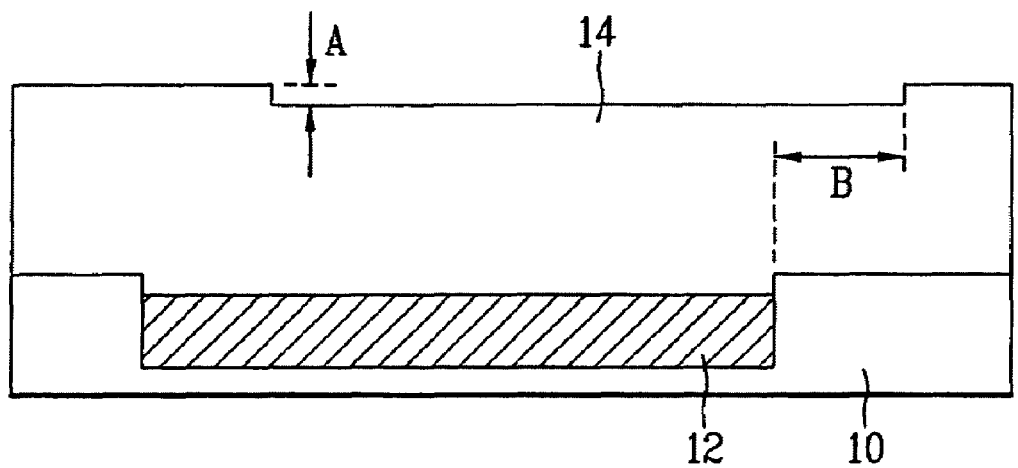
Figure 1C:
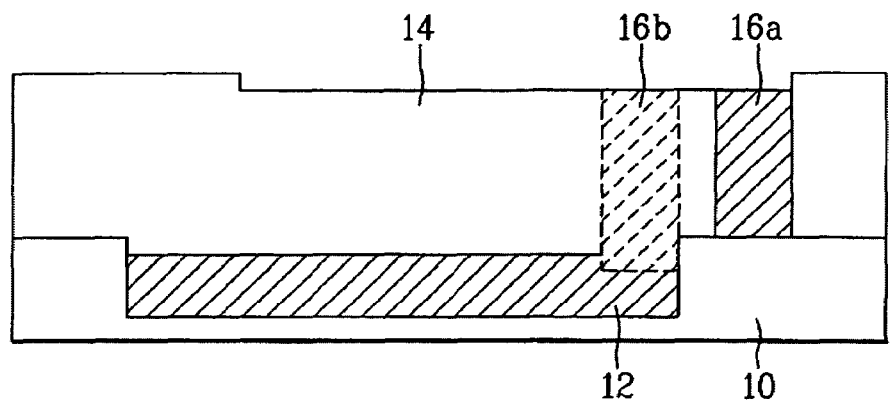

Hereinafter, preferred embodiments of the invention will be explained in details with reference to the accompanying drawings. This invention may, however, be embodied in many different forms and should not be construed as being limited to the embodiments set forth herein. Rather, these embodiments are provided so that this disclosure will be thorough and complete and will fully convey the scope of the invention to those skilled in the art. In the drawings, the thicknesses of layers are exaggerated for clear illustration of the invention. It will also be understood that when a layer is referred to as being "on" another layer or substrate, it can be directly on the other layer or substrate or third intervening layers may also be present. Like reference numerals denotes like elements throughout the drawings.

Figure 2:
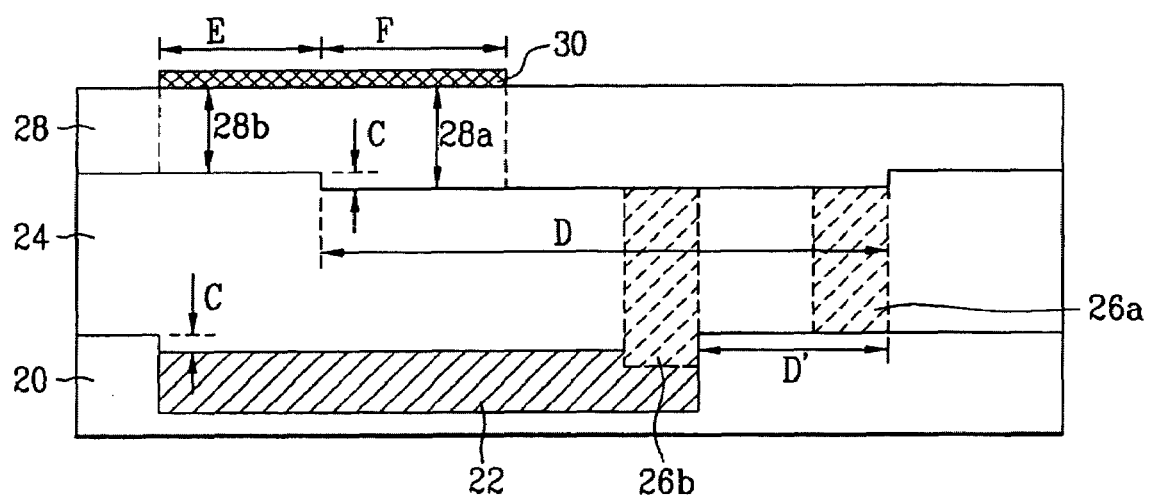
FIG. 2 is a cross-sectional view showing a typical semiconductor device having a buried layer/epitaxial layer and regions layered thereon.

FIG. 2 is a cross-sectional view generally showing a general structure of a semiconductor device having a buried layer, an epitaxial layer and regions stacked on top thereof.

Referring to FIG. 2, an initial oxide layer (not shown) is formed on a P-type semiconductor substrate 20. After a mask for formation of a buried layer is formed on a desired area of the initial oxide layer, the initial oxide layer is patterned using the mask. Using the patterned initial oxide layer as a mask, N-type ion injection and drive-in diffusion of impurities are performed to form an N-type buried layer 22.

Thereafter, the patterned initial oxide layer is removed and a P-type epitaxial layer 24 is formed on the substrate, including the N-type buried layer 22. A well region (or "plug") 26a may be formed in a desired or predetermined area of the P-type epitaxial layer 24. The well region or plug 26a/26b generally comprises a heavily-doped region, formed by conventional ion implantation of n- or p-type dopants (generally the same type as in buried layer 22), at an energy sufficient to form an implant region penetrating the entire thickness of epitaxial layer 24. The well region or plug 26a/26b may comprise more than one such implant (e.g., a relatively high-energy implant of arsenic-containing ions for bulk conductivity and relatively low diffusion, and a relatively low-energy implant of phosphorous-containing ions for improved ohmic contact with an overlying conductive structure).

Next, an interlayer insulation film 28 is formed on top of the resultant product (i.e., on the P-type epitaxial layer 24). The insulation film 28 may be patterned to form a contact hole. A contact plug (not shown), in contact with a conductive region (not shown) under the insulation film 28, is formed such that a conductive film is formed only in the contact hole. The contact hole generally exposes a non-functional portion of the epitaxial layer 24 (i.e., that does not have a doped or functional structure therein). Thus, in effect, the epitaxial layer 24 itself forms a lower electrode of a capacitor. The contact plug may comprise tungsten, aluminum, or a conventional aluminum-copper alloy, and it may further include a conventional liner between the plug and the insulation film 28.

A conductive film is deposited on the resultant product where the contact plug (not shown) is formed, and patterned to form a metallic wiring 30 in contact with the lower conductive region through the contact plug. The metallic wiring 30 generally overlaps a step of the stepped portion of the epitaxial layer 24, but in some cases, it will be positioned entirely over the depressed portion of the epitaxial layer 24 (corresponding to thickness or depth 28a) or the raised portion of the epitaxial layer 24 (corresponding to thickness or depth 28b). The metal wiring 30 may comprise any conventional conducting material, such as titanium, titanium nitride, aluminum, aluminum-copper alloy, tungsten, tungsten nitride, tantalum, tantalum nitride, etc., and laminated or stacked combinations thereof. For example, metal wiring 30 may comprise a titanium/titanium nitride bilayer, which may also form a liner for the contact plug.

On the other hand, as the N-type buried layer 22 is formed, a stepped portion C occurs between the buried layer surface and the substrate surface. In the epitaxial process for forming or growing the epitaxial layer, the growth direction of single crystal silicon may not be perpendicular to the substrate, depending upon orientation of the substrate and process conditions. In this case, the above stepped portion ('C' in FIG. 2) may shift to another place ('D" in FIG. 2) from its original position (e.g., the corresponding position of the buried layer 22).

The stepped portion C has about the same width D as the buried layer 22.

Therefore, since the stepped portion shifts from the burial layer surface and the substrate surface by a distance D', a layer to be formed after formation of the epitaxial layer 24 (e.g., the well region or plug region) may be formed at a position 26a in the epitaxial layer 24, as shown in FIG. 2. However, according to an embodiment of the invention, the correct position for the well region or plug region is at a position 26b in FIG. 2.

In other words, when an epitaxial process is carried out after formation of a buried (or other stepped) layer, a mobility of the stepped portion that may occur between the buried layer surface and the substrate surface is determined and, considering the mobility, shift or movement of the stepped portion, the well or plug region in the process should be shifted relative to the step of the stepped portion so as to form the well or plug region at the correct position.

Figure 3:
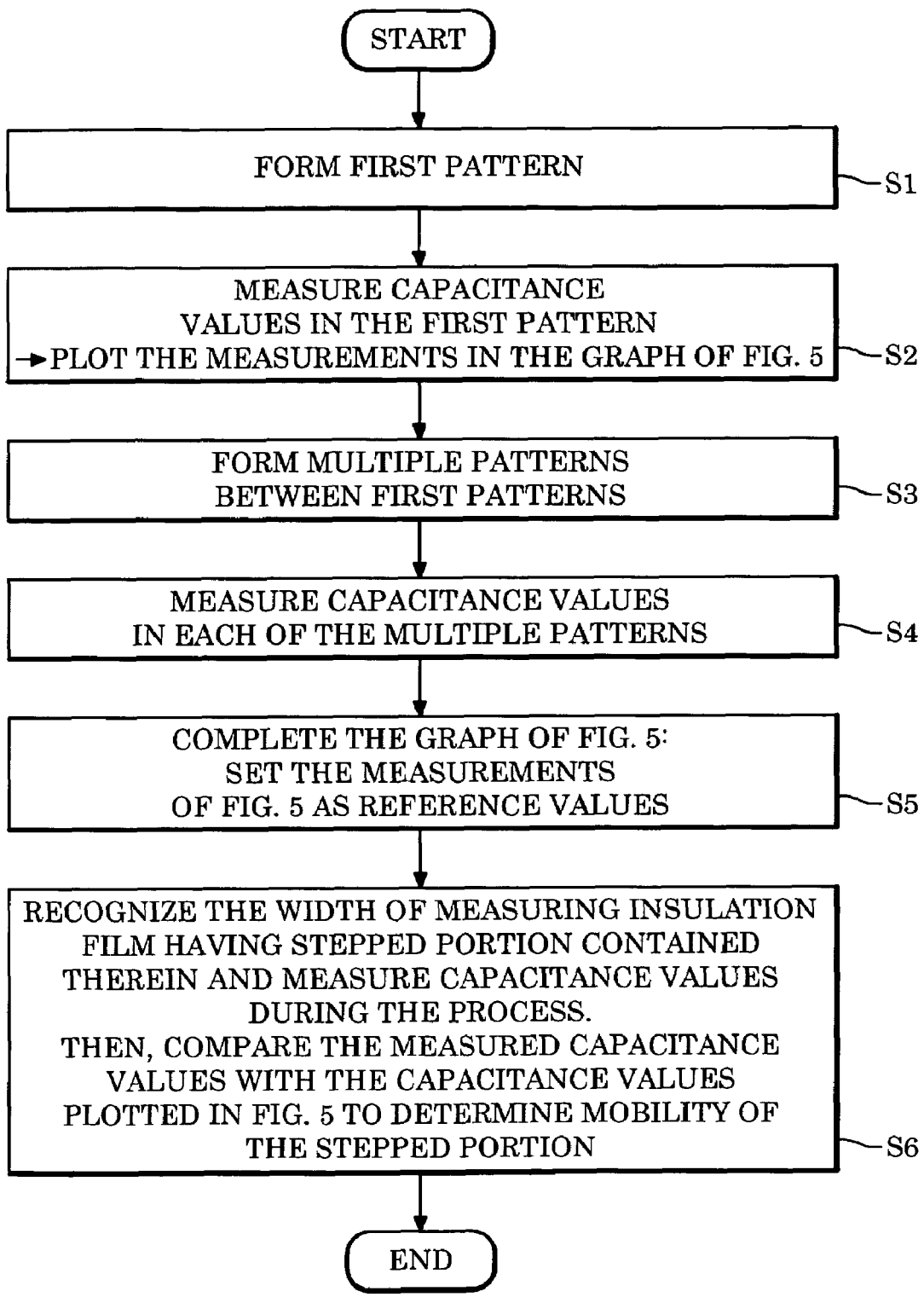
FIG. 3 is a flow chart explaining a method of measuring a mobility of the stepped portion according to the invention.
Figure 4A:
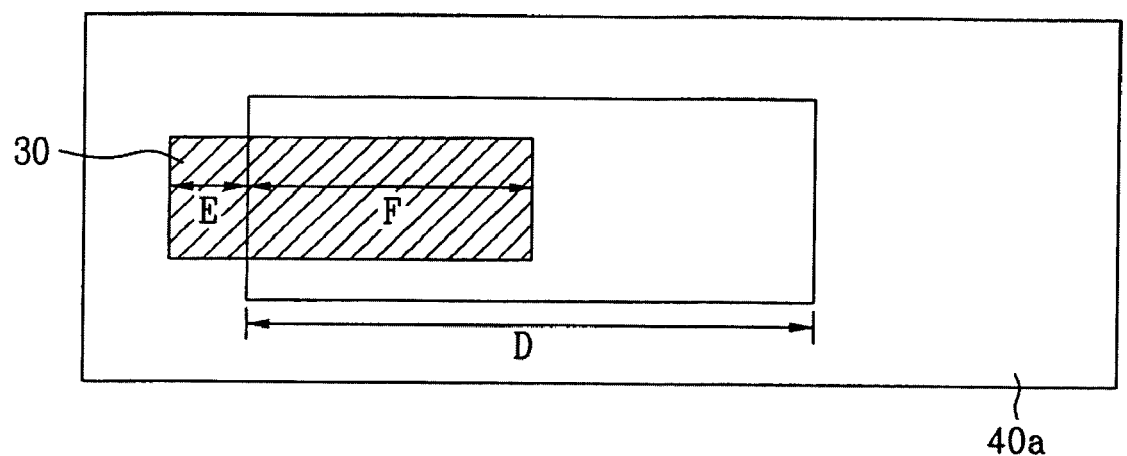
FIGS. 4a to 4c show the structure of part of multiple patterns formed for measuring capacitance values according to an embodiment of the invention.
Figure 4B:
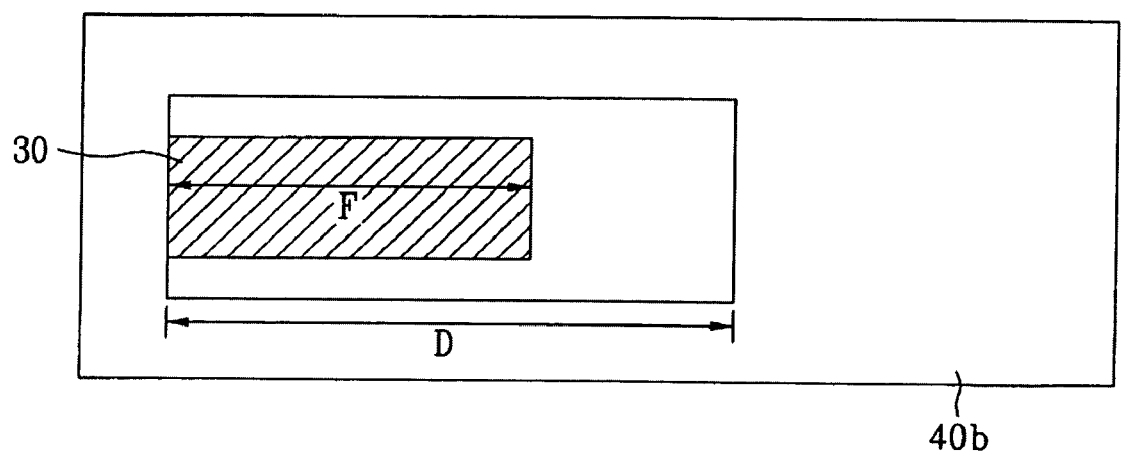
Figure 4C:
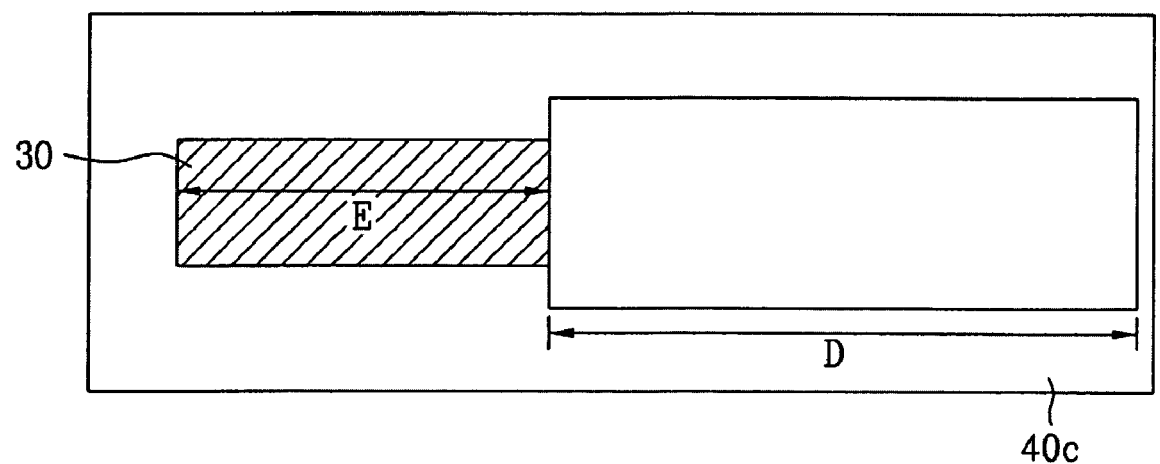

FIG. 3 shows a flow chart for measuring the mobility or shift distance of the stepped portion according to an embodiment of the invention. FIGS. 4a to 4c explain the structures of part of multiple patterns, which are formed to measure capacitance values according to an embodiment of the invention.

At the first step S1, a first pattern 40a is formed as shown in FIG. 4a.

Using a metallic wiring (e.g., 30 in FIG. 2) of fixed area, the first pattern 40a (FIG. 4A) includes a portion 28a containing a stepped portion C in the interlayer insulation film (F in FIG. 2) and a portion 28b not containing a stepped portion C in the interlayer insulation film (E in FIG. 2).

That is, the first pattern 40a (FIG. 4A) is formed in such a manner that the insulation film F containing the stepped portion overlaps with part (e.g., half or more) of the metallic wiring 30. The first pattern 40a may be formed in either case where the metal wiring 30 moves to the right or left side of the stepped portion D. In one alternate implementation, the metal wiring 30 has an end that is substantially aligned with the step between the upper surface of the buried layer 22 and the adjacent upper surface of the substrate 20.

Then, at the second step S2, a capacitance value of the first pattern 40a is measured.

The capacitance of the first pattern can be determined using the thickness of the interlayer insulation film formed between the epitaxial layer and the metallic wiring of fixed area, on which the capacitance depends. That is, within a metallic wiring of fixed area, capacitance values are determined respectively for the thickness of the interlayer insulation film in the portion containing the stepped portion and for the thickness of the interlayer insulation film in the portion not containing the stepped portion. The above-determined capacitance values can be summed because of the parallel connection thereof.

Therefore, depending on the thickness of the insulation film defined by formation of the first pattern, capacitance between the metallic wiring of fixed area and the epitaxial layer can be determined.

In one example, the capacitance value of the first pattern 40a is measured as being on the order of 0.0268. These measured values are indicated as coordinates F-1-0 or F-1-1 on the graph of FIG. 5.

Figure 5:
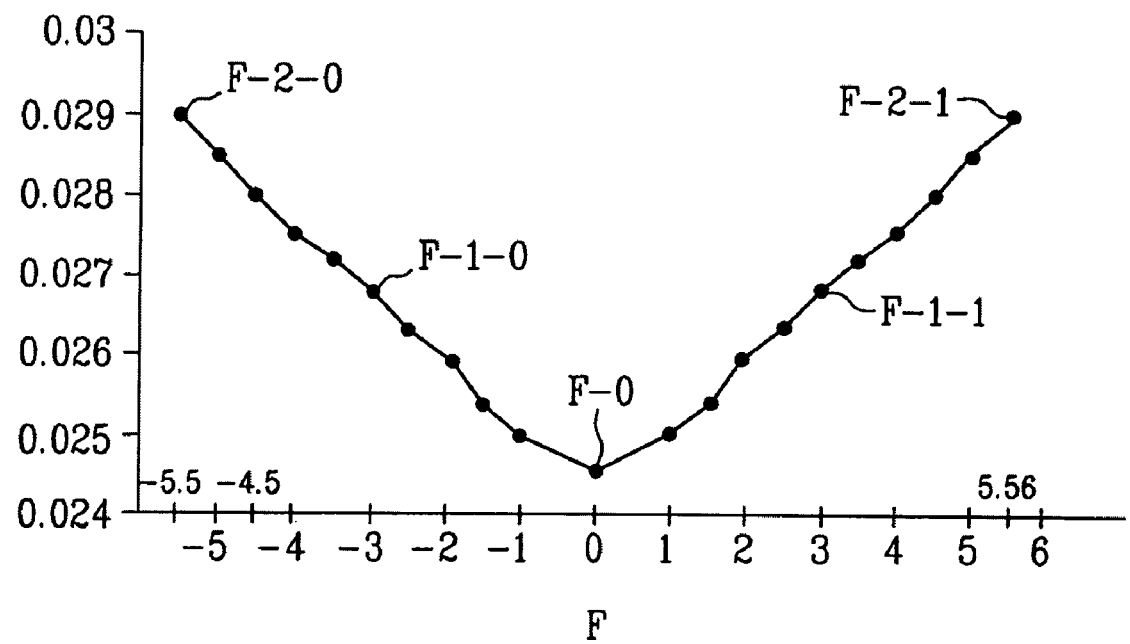
FIG. 5 is a graph plotting capacitance values measured in the patterns.

For example, where the pattern 40a is moved to the left side of the stepped portion (see, e.g., FIG. 4C), it is denoted by the coordinate F-1-0 in FIG. 5. Where the pattern 40a is moved to the right side (see, e.g., FIG. 4B), it is denoted by the coordinate F-1-1 in FIG. 5.

Then, at the third step S3, after obtaining summation of the capacitance values in the first pattern 40a, multiple patterns are further formed using metallic wiring of the same fixed area. In the further formed patterns, the ratio of the widths F:E of the metal (upper capacitor electrode) 30 over the insulation film in the stepped portion D to the upper capacitor electrode 30 over the insulation film outside the stepped portion have been changed or adjusted.

FIGS. 4b and 4c show the structures of part of multiple patterns formed to measure the capacitance values.

As shown in FIG. 4b, a second pattern 40b is formed in a manner that the metallic wiring/upper capacitor electrode 30 completely overlaps with the stepped portion of the insulation film D. As shown in FIG. 4c, a third pattern 40c is formed in such a way that the metallic wiring/upper capacitor electrode 30 does not overlap with the stepped portion of the insulation film D.

On the other hand, similar to FIGS. 4a and 4b, some fraction of the total number of patterns for capacitance measurements has been illustrated. However, multiple patterns are further formed having varying degrees of overlap with the stepped portion, between those shown in the above patterns. In these further patterns, the ratio of the widths F:E of the upper capacitor electrode 30 is varied or changed, generally in a systematic manner allowing reliable measurements and facile plotting/graphing of the capacitance measurements.

Thereafter, at the fourth step S4, capacitance values of the second and third patterns are measured.

In the example of FIG. 5, the capacitance value of the second pattern 40b in FIG. 4b is measured as being on the order of 0.0245, and the capacitance value of the third pattern 40c in FIG. 4c is measured as being 0.029.

Thereafter, at the fifth step S5, the capacitance values measured at the above patterns are plotted on a graph, as shown in FIG. 5.

The capacitance value 0.0245 of the second pattern 40b is shown on the coordinate F-0 in the graph of FIG. 5. The capacitance value 0.029 of the third pattern 40c is shown on the coordinates F-2-0 or F-2-1 in the graph of FIG. 5.

For example, when the upper capacitor electrode 30 is moved to the left side the stepped portion, it is denoted by the coordinate F-2-0 of FIG. 5. When the upper capacitor electrode 30 is moved to the right side, it is denoted by the coordinate F-2-1 of FIG. 5.

Then, at the sixth step S6, referring to the graph of FIG. 5, which has been plotted according to the measured capacitance values as reference values, the width of the stepped portion of the insulation film is recognized or determined to measure a capacitance value thereof during the process of the invention. This capacitance value is compared with any one of those plotted on the graph of FIG. 5, thereby enabling determination and/or correlation of the mobility or shift distance of the stepped portion.

That is, in case where the width of the stepped portion of an insulation film is recognized or determined as being, e.g., $-1$ during the manufacturing process, a minimum capacitance value (e.g., of 0.0245 as shown in FIG. 5) is measured when the upper electrode is entirely over the stepped portion. It can thus be seen that the upper electrode may advantageously have a width of less than the width D of the stepped portion. In FIG. 5, the capacitance of 0.0245 is a value that is measured when the metal wiring/upper electrode is centered over the stepped portion of the epitaxial layer under the interlayer insulation width (i.e., its E:F ratio is zero [0]). Therefore, from the initial measurement F-1-0, second measurements F-2-0 and F-2-1, the amount or distance of any movement of the metal wiring/upper electrode to the left or right of the stepped portion, and the known widths of the stepped portion (D) and of the metal wiring/upper electrode (from which the E:F or F:E ratio can be determined), it can be seen that the shift distance is on the order of 1 μm.

Therefore, the process for forming the buried layer and layers formed thereon, i.e., a well region can be carried out, considering a 1 μm shift from the reference. Thus, the well region can be formed at the correct position in the process, i.e., at location 26b of FIG. 2.

According to the present invention, multiple patterns of a metallic wiring of fixed area are formed, which have adjusted or varying ratios of widths over a stepped insulation film. Capacitances according to the patterns are measured respectively to establish a reference value. After forming a buried layer and an epitaxial layer, the mobility or shift distance of the stepped portion can be determined, so that the alignment between the buried and epitaxial layers and layer formed on top thereof can be precisely achieved.

In the method of measuring a pattern shift in a semiconductor device according to the invention, multiple patterns are formed using a metallic wiring of fixed area, which have adjusted or varying ratios of widths of over a stepped portion and over a non-stepped portion of an underlying epitaxial layer. Capacitances according to the patterns are measured respectively to establish a reference value. After forming a buried layer and an epitaxial layer, the mobility or shift distance of the stepped portion can be determined, so that the alignment between the buried and epitaxial layers and layer formed on top thereof can be precisely achieved advantageously.

Although the present invention has been described with reference to several exemplary embodiments, the description is illustrative of the invention and is not to be construed as limiting the invention. Various modifications, variations and replacements may occur to those skilled in the art, without departing from the spirit and scope of the invention as defined by the appended claims.

What is claimed is:

1. A method of measuring a pattern shift in manufacturing a semiconductor device, comprising the steps of:
    measuring a first capacitance value of a first metal wiring on an insulation film, the first metal wiring being over a step that is a shift distance away from a corresponding step below an underlying layer that is under the insulation film, the first metal wiring having a first width ratio of widths over a raised portion and over a depressed portion of the underlying layer;
    forming a plurality of second metal wirings, each second metal wiring having a unique second width ratio different from the first width ratio;
    measuring capacitance values of the plurality of second metal wirings multiple;

establishing reference values using the measured capacitance values; and comparing The first capacitance value with the established reference values to determine the shift distance.

2. The method as claimed in claim 1, wherein the first capacitance value depends on a thickness of the insulation film.

3. The method as claimed in claim 1, further comprising:
forming a buried layer in a semiconductor substrate, wherein the corresponding step is formed between an upper surface of the buried layer and an adjacent upper surface of the semiconductor substrate;
forming an epitaxial layer as the underlying layer on the semiconductor substrate and the buried layer, the epitaxial layer having the step that is the shift distance away from the corresponding step;
forming the insulation film on the epitaxial layer; and
forming each of the first metal wiring and the plurality of second metal wirings in a predetermined area of the insulation film.

4. The method as claimed in claim 3, wherein forming the buried layer comprises performing an N-type ion injection using a patterned initial oxide layer as a mask.

5. The method as claimed in claim 4, wherein forming the buried layer further comprises driving in the N-type ion impurities after performing the N-type ion injection.

6. The method as claimed in claim 3, wherein the epitaxial layer comprises P-type impurities.

7. The method as claimed in claim 3, further comprising forming a well region or a plug in a predetermined area of the epitaxial layer.

8. The method as claimed in claim 7, wherein forming the well region or the plug comprises performing an ion implantation at an energy sufficient to form an implant region penetrating an entire thickness of the epitaxial layer.

9. The method as claimed in claim 8, wherein the well region or the plug comprises a relatively high-energy implant of arsenic-containing ions and a relatively low-energy implant of phosphorous-containing ions.

10. The method as claimed in claim 9, wherein the relatively high-energy implant of arsenic-containing ions is configured to provide bulk conductivity of the well region or the plug.

11. The method as claimed in claim 9, wherein the relatively low-energy implant is configured to improve an ohmic contact of the well region or the plug with an overlying conductive structure.

12. The method as claimed in claim 7, comprising forming the plug wherein the plug comprises one or more materials selected from the group consisting of tungsten, aluminum, and copper.

13. The method as claimed in claim 7, comprising forming the plug, wherein the plug comprises one or more materials selected from the group consisting of tungsten, aluminum, and copper.

14. The method as claimed in claim 3, wherein at least one of the metal wirings has an end that is substantially aligned with the corresponding step.

15. The method as claimed in claim 1, wherein the underlying layer comprises an epitaxial layer.

16. The method as claimed in claim 5, further comprising the step of forming the epitaxial layer.

17. The method as claimed in claim 16, further comprising the step of forming the insulation film on the epitaxial layer.

18. The method as claimed in claim 17, further comprising the step of forming a bonding region in a desired area within the epitaxial layer before forming the insulation film.

19. The method as claimed in claim 1, wherein the metal wiring comprises one or more materials selected from a group consisting of titanium, titanium nitride, aluminum, copper, tungsten, tungsten nitride, tantalum, and tantalum nitride.

\* \* \* \* \*